United States Patent [19]
Nido

[11] Patent Number: 5,793,054
[45] Date of Patent: Aug. 11, 1998

[54] GALLIUM NITRIDE TYPE COMPOUND SEMICONDUCTOR LIGHT EMITTING ELEMENT

[75] Inventor: Masaaki Nido, Tokyo, Japan

[73] Assignee: NEC Corporation, Japan

[21] Appl. No.: 662,697

[22] Filed: Jun. 13, 1996

[30] Foreign Application Priority Data

Jun. 15, 1995 [JP] Japan .................. 7-171575

[51] Int. Cl.$^6$ .................. H01L 29/06
[52] U.S. Cl. .................. 257/18; 257/22; 257/94; 257/103; 257/628
[58] Field of Search .................. 257/14, 18, 22, 257/94, 103, 627, 628

[56] References Cited

U.S. PATENT DOCUMENTS

| | | | |
|---|---|---|---|
| 5,146,465 | 9/1992 | Khan et al. | 372/45 |
| 5,585,648 | 12/1996 | Tischler | 257/94 |
| 5,689,123 | 11/1997 | Major et al. | 257/18 |

OTHER PUBLICATIONS

"Candela–class high–brightness InGaN/AlGaN double–heterostructure blue–light–emitting diodes": Nakamura et al Appl. Phys. Lett. 64 (13), Mar. 28, 1994; pp. 1687–1689.

"High–Performance 1.5 um Wavelenght InGaAs–InGaAsP Strained Quantum Well Lasers and Amplifiers" Thijs et al; IEEE Journal of Quantum Electronics, vol. 27, No. 6, Jun. 6, 1991 pp. 1426–1439.

"Optical Gain Calculation of Wurtzite GaN/AlGaN Quantum Well Laser" Kamiyama et al Jpn. J. Appli. Phys. vol. 34, (1995) Part 2, No. 7A, Jul. 1, 1993; pp. L821–L823.

"High–Brightness InGaN Blue, Green and Yellow Light––Emitting Diodes wiht Quantum Well Structures" Nakamura et al Jpn. J. Appln. Phys. vol. 34, (1995) Part 2, No. 7A, Jul. 1, 1995, pp. L797–L799.

*Primary Examiner*—Olik Chaudhuri
*Assistant Examiner*—Nathan Kelley
*Attorney, Agent, or Firm*—Hayes, Soloway, Hennessey, Grossman & Hage, P.C.

[57] ABSTRACT

A gallium nitride type compound semiconductor light emitting element, such as a semiconductor laser, a light emitting diode is constructed by forming an $In_{0.06}Ga_{0.94}N$ buffer layer, an n-type $In_{0.06}Ga_{0.94}N$ clad layer, an n-type $In_{0.06}Al_{0.15}Ga_{0.79}N$ clad layer, an undoped GaN active layer having layer thickness of 50 nm, a p-type $In_{0.06}Al_{0.15}Ga_{0.79}N$ clad layer and a p-type $In_{0.06}Ga_{0.94}N$ cap layer on a (0001) azimuth sapphire substrate. A p-side electrode is formed on the p-type $In_{0.06}Ga_{0.94}N$ cap layer, and an n-side electrode is formed on the n-type $In_{0.06}Ga_{0.94}N$ clad layer. In the construction set forth above, a greater thickness for the active layer is provided. Also, tensile strain is applied to the active layer. Light is taken out in parallel direction to the substrate. This threshold current of the semiconductor laser is lowered and light emitting efficiency of the light emitting diode is improved.

6 Claims, 12 Drawing Sheets

GALLIUM NITRIDE TYPE COMPOUND SEMICONDUCTOR LIGHT EMITTING ELEMENT

BACKGROUND OF THE INVENTION

1. Field of the Invention

The present invention relates generally to a gallium nitride type compound semiconductor light emitting element. More specifically, the invention relates to structures of a gallium nitride type compound semiconductor laser which has low oscillation threshold current and of a gallium nitride type compound semiconductor diode which has low operation current and superior light emitting efficiency.

2. Description of the Related Art

Gallium nitride type compound semiconductors have been proposed for use in light emitting diodes and semiconductor lasers as a material for emitting light in the range of sea green to ultraviolet color, and various reports have been presented therefor.

As prior art 1, a gallium nitride type compound semiconductor light emitting diode having the following structure has been reported. (For example, S. Nakamura et al. Applied Physics Letters, 64, pp 1687 to 1689, 1994) FIG. 1 is a section showing a layer structure of a light emitting diode of prior art 1.

The light emitting diode according to prior art 1 has a structure, in which a GaN buffer layer 52, an n-type GaN clad layer 53, an n-type $Al_{0.15}Ga_{0.85}N$ clad layer 54, a Zn doped $In_{0.06}Ga_{0.94}N$ active layer 55 in layer thickness of 50 nm, a p-type $Al_{0.15}Ga_{0.85}N$ clad layer 56 and a p-type GaN cap layer 57 are grown on a (0001) azimuth sapphire substrate 51. A p-side electrode 58 is formed on the p-type GaN cap layer 57. An n-side electrode 59 is formed on the n-type GaN clad layer 53. An emitted light 60 from the light emitting diode is taken out from the p-side electrode 58.

According to the light emitting diode of this structure, 1.5 mW of output is obtained with 20 mA of current. Light emission on the $In_{0.06}Ga_{0.94}N$ active layer 55 is a light emission from a deep level associated with Zn and has an energy smaller than a band gap of the active layer material in the extent of about 0.5 eV. When the sapphire substrate 51 having a (0001) azimuth is employed, a gallium nitride type compound semiconductor stacked thereon has a Wurtzite crystal structure of (0001) azimuth. On the other hand, while there is a lattice unconformity of about 16% between the sapphire substrate and GaN, the n-type GaN clad layer 53 stacked on the GaN buffer layer 52 has a lattice constant equal to an original GaN and thus indeed serves as a substrate for the semiconductor layers stacked thereon. Accordingly, on the $In_{0.06}Ga_{0.94}N$ active layer 55, approximately 0.7% of in-plane isotropic compressive strain is applied. It should be noted that, in the prior art 1, strain on the lattice of the active layer is not important.

On the other hand, in a semiconductor layer employing semiconductor of III–V group compound having zinc blend structure other than a gallium nitride type compound semiconductor, improvement of characteristics, such as lowering of an oscillation threshold current or so forth has been achieved by positively utilizing in-plane isotropic strain in the active layer. For example, as the prior art of this type, in-plane isotropic strain has been utilized in a 1.5 μm band InGaAs/InGaAsP strain quantum well laser on a (001) azimuth InP substrate. (For example, P. J. A. Thijs et al., IEEE Journal of Quantum Electronics vol. 27, No. 6, pp 1426 to 1439, 1991)

FIG. 2 shows a layer structure of a compressive strain quantum well semiconductor laser of prior art 2, and FIG. 3 shows a layer structure of a tensily strained quantum well semiconductor laser of prior art 3, respectively.

As shown in FIG. 2, the semiconductor laser of the prior art 2 has a structure, in which an n-type InP clad layer 62, an n-type InGaAsP light confinement layer 63 of 1.3 μm wavelength composition, a multi quantum well active layer, in which an InGaAsP barrier layer 64 of 1.3 μm wavelength composition and an $In_{0.7}Ga_{0.3}As$ quantum well layer 65 are alternately stacked for four cycles, a p-type InGaAsP light confinement layer 66 of 1.3 μm wavelength composition, a p-type InP clad layer 67, a p-type $In_{0.53}Ga_{0.47}As$ cap layer 68 are grown in order on a (001) azimuth n-type InP substrate 61. A p-side electrode 69 is formed on the p-type $In_{0.53}Ga_{0.47}As$ cap layer and an n-side electrode 70 is formed on the back surface of the substrate. All of the semiconductor layers including the substrate are zinc blend structures. The quantum well layer 65 has greater lattice constant than the InP substrate 61 and a compressive strain of 1.2%.

As shown in FIG. 3, the semiconductor laser of the prior art 3 has a structure, in which an n-type InP clad layer 72, an n-type InGaAsP light confinement layer 73 of 1.15 μm wavelength composition, a multi quantum well active layer, in which an InGaAsP barrier layer 74 of 1.15 μm wavelength composition and an $In_{0.3}Ga_{0.7}As$ quantum layer 75 are stacked alternately for four cycles, a p-type IaGaAsP light confinement layer 76 of 1.15 μm wavelength composition, a p-type InP clad layer 77 and p-type $In_{0.53}Ga_{0.47}As$ cap layer 78 are grown in order on a (001) azimuth n-type InP substrate 71. A p-side electrode 79 is formed on the p-type $In_{0.53}Ga_{0.47}As$ cap layer 78 and an n-side electrode 80 is formed on the back side of the substrate. All of the semiconductor layers including the substrate are zinc blend structures. The quantum well layer 75 has smaller lattice constant than the InP substrate 71 and a tensile strain of 1.6%.

FIG. 4 shows a result of calculation of relationship between an In content x of $In_xGa_{1-x}As$ of a zinc blend structure stacked on the (001) azimuth InP substrate and Γ point band energy. When In content x is 0.53, $In_xGa_{1-x}As$ establishes lattice matching with the InP substrate. If x>0.53, a compressive strain is applied to the $In_xGa_{1-x}As$ layer, and if x<0.53, a tensile strain is applied to the $In_xGa_{1-x}As$ layer. A valence band edge is split into a heavy hole band, in which a band based on an atomic orbital of $(1/\sqrt{2})|(p_x+ip_y)\alpha>$ and $(1/\sqrt{2})|(p_x-ip_y)\beta>$ is degenerated, and a light hole band, in which a band based on an atomic orbital of $(1/\sqrt{6})|(p_x+ip_y)\beta>-\sqrt{(2/3)}|p_z\cdot\alpha>$ and $-(1/\sqrt{6})|(p_{x-1}-ip_y)\alpha>-\sqrt{(2/3)}|p_z\cdot\beta>$ is degenerated.

In the foregoing, $p_x$, $p_y$ and $p_z$ represent p-type atomic orbitals oriented in x, y and z directions. The x, y and z are respectively <100>, <010> and <001> azimuths. α and β represent mutually different spinning conditions.

Where there is compressive strain as in the prior art 2, the valence band edge becomes the heavy hole. As a result of splitting into the light hole and heavy hole, an in-plane state density of the quantum well of the heavy hole is reduced so that a sufficient gain is obtained at lower hole density to lower the threshold current of the semiconductor laser.

On the other hand, in case where there is tensile strain as in the prior art 3, the valence band edge becomes the light hole. Then, an in-plane state density of the quantum well becomes greater. However, since an electric dipole moment in the z direction between the light hole and the conduction band is greater than the electrical dipole moment between the heavy hole and the conduction band in the extent of approximately 30%, gain can be obtained at smaller hole density to lower threshold current of the semiconductor laser.

In either of the prior arts 2 or 3, by doping p-type impurity in the barrier layer adjacent the quantum well, hole density while current is not charged is elevated for reducing hole injection amount by the current to lower the oscillation threshold current. It should be noted that, in case of the semiconductor laser for oscillating at long wavelength of longer than or equal to 1.3 µm, non-light emitting recombination rate and light absorption between the valence bands due to Auger effect. Thus, the effect of doping of p-type impurity should be smaller, or may serve to raise the oscillation threshold current. It should be noted that the prior arts 2 and 3 is applicable not only for a semiconductor laser having low oscillation threshold current but also for a light emitting diode having low operation current.

However, in a case where light emission from a deep level of the active layer by doping is employed as in the prior art 1, an emission spectrum is wider in comparison with light emission between bands to lower the efficiency. Accordingly, when the structure of the prior art 1 is employed, difficulty is encountered to perform laser oscillation.

Even in a gallium nitride type compound semiconductor, it is expected to be possible to lower the oscillation threshold current of the semiconductor laser or to lower operation current of the light emitting diode by intentionally incorporating in-plane isotropic strain in the active layer, similarly to the prior arts 2 and 3 employing a zinc blend structure III–V group compound semiconductor, when light emission between band is performed without doping impurity.

However, a gallium nitride type compound semiconductor may take not only a zinc blend structure but also a Wurtzite structure, and a Wurtzite structure is more stable than a zinc blend structure. Also, spin-orbit interaction splitting energies are 0.34 eV and 0.11 eV in case of GaAs and InP, whereas the spin-orbit interaction splitting energy of GaN is quite small in the extent of 0.011 eV. Accordingly, in case of a gallium nitride type material, the effect of in-plane strain is expected to be different from those of the GaAs material or InP type material.

SUMMARY OF THE INVENTION

It is an object of the present invention to provide a gallium nitride type compound semiconductor light emitting element of Wurtzite structure and zinc blend structure, which employ interband light emission having high light emission efficiency and can achieve large light output by low current density.

Another object of the present invention is to provide a light emitting diode and a semiconductor laser having high efficiency in the sea green to ultraviolet color band.

A gallium nitride type compound semiconductor light emitting element, according to the present invention, has a quantum well layer consisting of a $Ga_xAl_{1-x}N$ layer ($0 \leq x \leq 1$) of Wurtzite structure having a <0001> azimuth perpendicular to a substrate surface or a zinc blend structure having a <001> azimuth perpendicular to the substrate surface, or a $Ga_yAl_zIn_{1-y-z}N$ layer ($0 \leq y, z \leq 1, 0 < y+z < 1$), as a light emitting layer. The quantum well layer has a layer thickness greater than or equal to 10 nm and is under tensile strain, and with light being taken out in parallel direction to said substrate surface.

Concerning a gallium nitride type compound semiconductor of Wurtzite structure and zinc blend structure, the inventors have calculated the effect of in-plane isotropic strain relative to the band structure. As a result, it has been found that, in a gallium nitride type compound semiconductor, not only in the case of a Wurtzite structure but also in the case of a zinc blend structure, the effect of in-plane isotropic strain is differentiated from the other III–V group compound semiconductor of zinc blend structure. Also, a method of applying of the in-plane isotropic strain to a gallium nitride type compound semiconductor light emitting element is found.

Concerning a gallium nitride type compound semiconductor, since there is reported about the influence of in-plane isotropic strain upon the band structure, the influence of in-plane isotropic strain upon the band structure of a zinc blend structure of GaN (cubic structure: hereinafter referred to c-GaN) and a Wurtzite structure of GaN (hexagonal structure: hereinafter referred to h-GaN) has been predicted by band analysis employing empirical strong tight-binding method taking spin-orbital interaction. FIG. 5A shows a result of calculation showing a relationship between the Γ point band energy of c-GaN on a (001) azimuth substrate and in-plane isotropic strain, and FIG. 5B shows a result of calculation showing a relationship between the Γ point band energy of h-GaN on a (0001) azimuth substrate and in-plane isotropic strain. In FIGS. 5A and 5B, only bands in the vicinity of the valence band edge are shown. Positive strain amount represents tensile strain (lattice constant of substrate>lattice constant of GaN) and negative strain represents compressive strain (lattice constant of substrate<lattice constant of GaN).

Concerning coordinate axes, x and y directions are present in the substrate surface and z direction extends perpendicularly to the substrate surface. In case of tensile strain (positive strain) common to c-GaN and h-GaN, the band is split into double degeneracy (spin degeneracy) of the band 45 having high energy and double degeneracy of two adjacent bands 46 and 47 of low energy. The band 45 consists of p-type atomic orbital oriented perpendicular to the substrate surface and bands 46 and 47 consist of p-type atomic orbital oriented in-plane of the substrate surface.

On the other hand, in case of compressive strain (negative strain), the band is split into double degeneracy of two adjacent bands 48 and 49 having high energy and double degeneracy of a band 50 having low energy. The bands 48 and 49 consist of p-type atomic orbital oriented in-plane of the substrate surface, and the band 50 consists of p-type atomic orbital oriented perpendicular to the substrate surface.

The split condition of the valence band edge by in-plane isotropic strain should be appreciated to be far different from the case of $In_xGa_{1-x}As$ shown in FIG. 4. This is primary caused by quite small spin-orbital interaction split energy in GaN.

Next, in order to observe state density of the valence band edge, band structures (a relationship between the band energy and crystal wave number: E-k relationship) of c-GaN and h-GaN were calculated. Concerning c-GaN under no strain, FIGS. 6A and 6B show E-k relationships in a direction toward X point from Γ point (z direction) and in a direction toward K point from Γ point (in-plane of x-y plane), respectively. The degree of degeneracy of the band is denoted by numerals in FIGS. 6A and 6B.

FIGS. 7A and 7B show E-k relationships for c-GaN under compressive strain (1%) similar to FIGS. 6A and 6B. Also, FIGS. 8A and 8B show E-k relationships for c-GaN under tensile strain (1%) similar to FIGS. 6A and 6B. Considering degeneracy degree of the bands and effective mass (curvature of band) based on these figures, the state density in the vicinity of the point Γ at the top of the value becomes minimum when tensile strain is applied.

Concerning h-GaN under no strain, FIGS. 9A and 9B show E-k relationships in a direction toward A point from Γ point (z direction) and in a direction toward K point from Γ point (in-plane of x-y plane), respectively. The degree of degeneracy of the band is denoted by numerals in FIGS. 9A and 9B.

FIGS. 10A and 10B show E-k relationships under compressive strain (1%) for h-GaN, and FIGS. 11A and 11B show E-k relationships under tensile strain (1%) for h-GaN similarly to FIGS. 9A and 9B. From FIGS. 9A to 11B, similarly to the case of the c-GaN, considering degeneracy degree of the band and effective mass (curvature of the band), the state density in the vicinity of the Γ point at the top of the valence band becomes minimum in the case of tensile strain.

In common to c-GaN and h-GaN, under the tensile strain, the Γ point valence band edge consists of p-type atomic orbital oriented in the direction perpendicular to the substrate surface (z direction). Therefore, the dipole moment in the z-direction becomes greater than the dipole moment in the z-direction of the prior art 3 set forth above. Thus, a large gain with respect to the light deflected in the z-direction results. It should be noted that, in common to c-GaN and h-GaN, when the GaN layer is too thin, the atomic orbital of the least level hole sub-band becomes p-type atomic orbital oriented in-plane (x—y direction) on the substrate surface due to the quantum confinement effect in the z-direction. Thus, it is required to provide the thicker layer thickness. This is because the effective mass in the z-direction of the band having p-type atomic orbital oriented in the Z-direction becomes smaller than the effective mass in the z-direction of the band having p-type atomic orbital oriented in-plane of the x-y surface.

Accordingly, in order to effectively utilize the dipole moment in the perpendicular direction to the substrate surface, even when a multi quantum well is employed as the active layer, it is preferred that the layer thickness of the light emitting layer (quantum well layer) is greater than or equal to 10 nm. Also, in the present invention, by providing greater thickness of the light emitting layer (quantum well layer), the tensile strain in the layer is desirably less than or equal to 3%.

As the result set forth above, by employing tensile strain GaN having sufficiently large thickness as an active layer, and by taking out the light deflecting in the z-direction, the state density of the valence band edge becomes minimum and the dipole moment becomes large. By these two effects, the oscillation threshold current of the semiconductor laser can be significantly reduced. Also, on case of the light emitting diode, light emitting efficiency can be remarkably improved. It should be noted that, in order to take out the light deflected in the z-direction, it becomes necessary to take out the light in the in-plane direction of the x-y plane.

Concerning nitride type material other than GaN, AlN is expected to have smaller spin-orbital interaction split energy than GaN, and to have the similar band structure to GaN. Therefore, it is expected that the similar effect may be obtained by the similar method as that set forth above. This is true for a mixed crystal of GaN and AlN. Since InN has relative large spin orbital energy (in the order of 0.09V), it is expected to have the band structure having intermediate characteristics of GaN and GaAs. However, in case of InGaAlN having small mixed crystal ratio of In, the similar effect by the similar method for GaN is expected.

As set forth above, when a gallium nitride type compound semiconductor is employed to form the light emitting layer, it should be appreciated that the application of in-plane strain is differentiated from that in a InP, GaAs type material. Furthermore, in addition to the application of tensile strain as set forth above, by preliminarily accumulating holes in the light emitting layer by doping p-type impurity, similarly to the foregoing prior arts 2 and 3, the oscillation threshold current of the semiconductor laser can be further lowered. It should be noted that, in this case, the light emitting layer is formed with the multi quantum well, in which the barrier layers and the quantum wells are alternately stacked, and p-type impurity is doped only in the barrier layer.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

Next, the preferred embodiments of the present invention will be discussed hereinafter with reference to the accompanying drawings. It should be noted that the following embodiments will be discussed with respect to a gallium nitride type compound semiconductor laser. In the following description, numerous specific details are set forth in order to provide a thorough understanding of the present invention. It will be obvious, however, to those skilled in the art that the present invention may be practiced without these specific details. In other instances, well-known structures are not shown in detail in order not to unnecessary obscure the present invention.

[FIRST EMBODIMENT]

Figure 1:
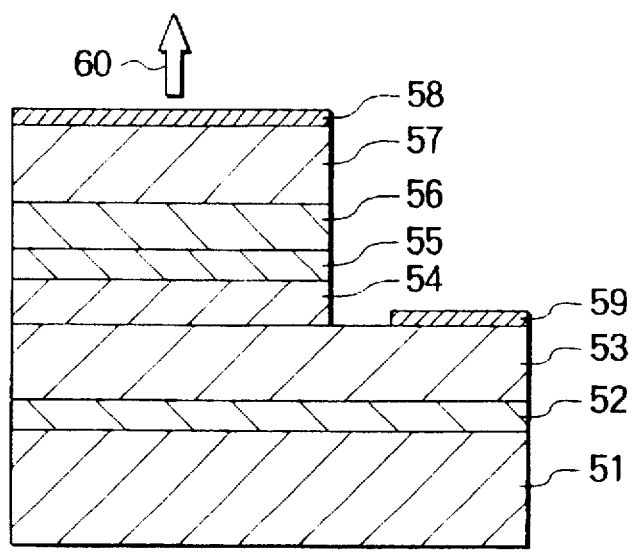
FIG. 1 is a section of a light emitting diode of prior art 1.
Figure 2:
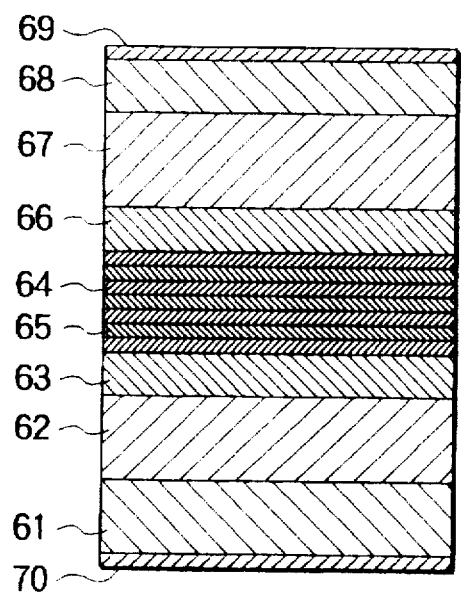
FIG. 2 is a section of a semiconductor laser of prior art 2.
Figure 3:
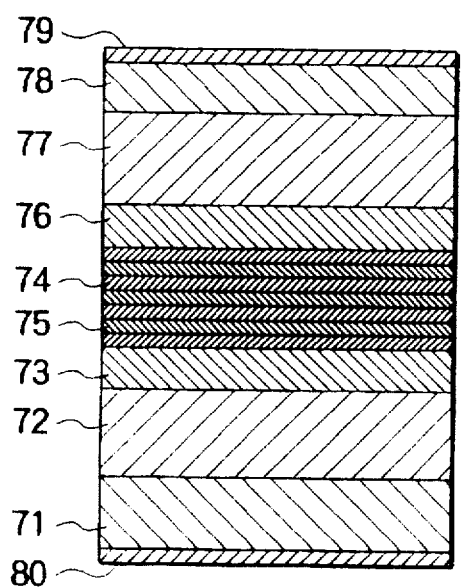
FIG. 3 is a section of a semiconductor laser of prior art 3.
Figure 4:
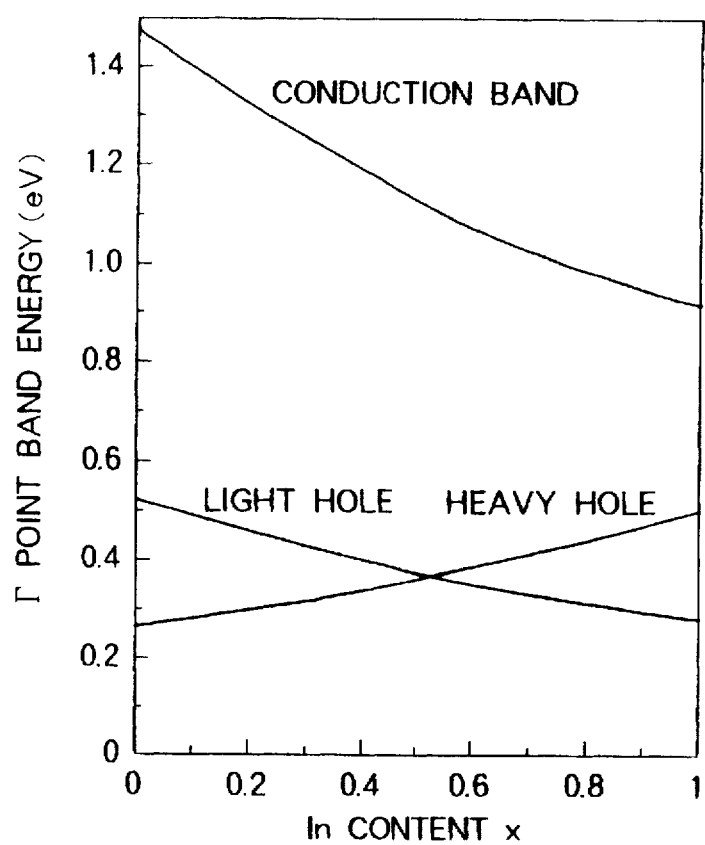
FIG. 4 is a characteristic curve showing a relationship between In content x in $In_xGa_{1-x}As$ on a InP substrate and Γ point band energy.
Figure 5A:
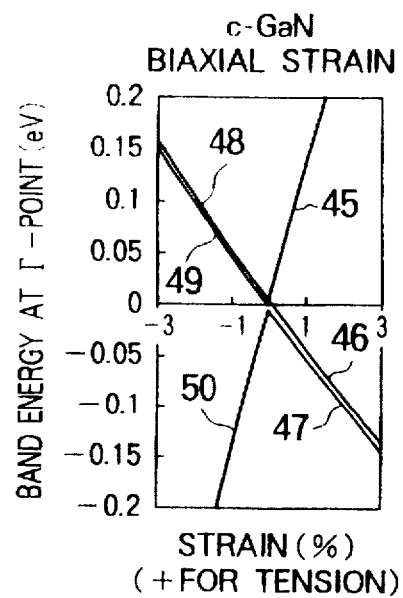
FIGS. 5A and 5B are characteristic curve showing relationship between in-plane isotropic strain amounts in a zinc blend structure and a Wurtzite structure and Γ point band energy.
Figure 5B:
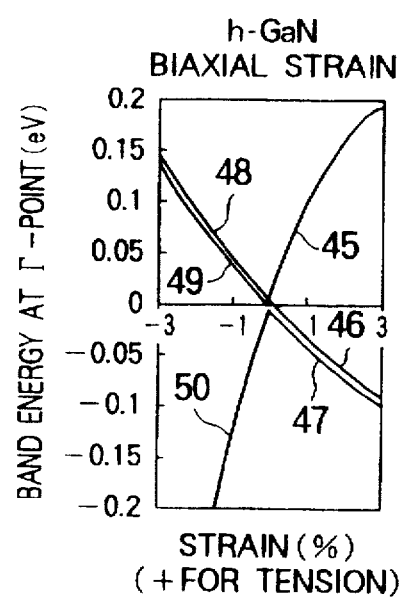
Figure 6A:
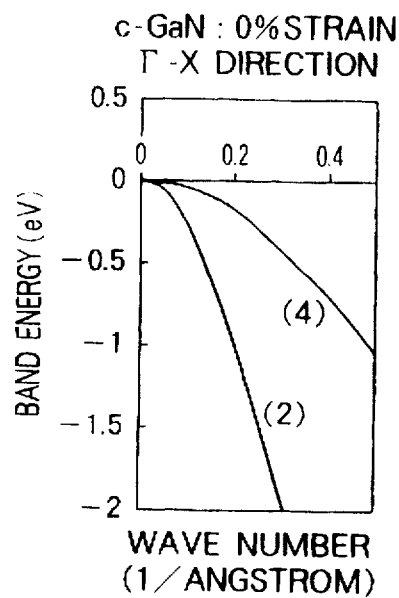
FIGS. 6A and 6B are characteristic curves showing band structures (energy-wave number relationship) of a zinc blend structure lattice-matched GaN.
Figure 6B:
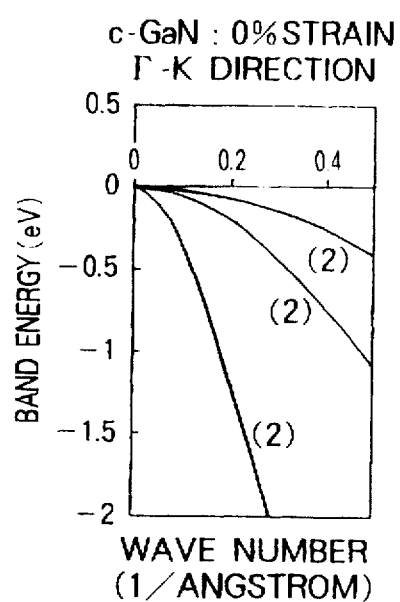
Figure 7A:
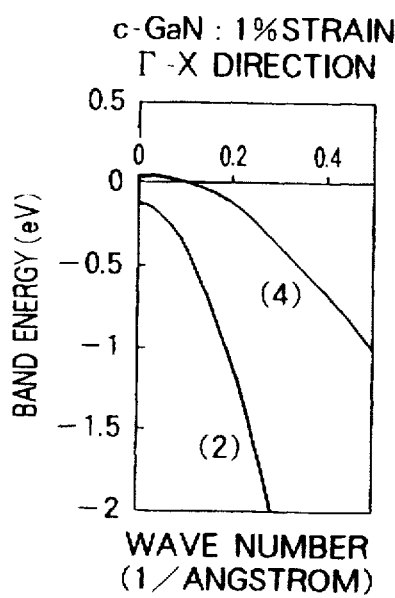
FIGS. 7A and 7B are characteristic curves showing band structures (energy-wave number relationship) of a zinc blend structure under 1% compressive strain GaN.
Figure 7B:
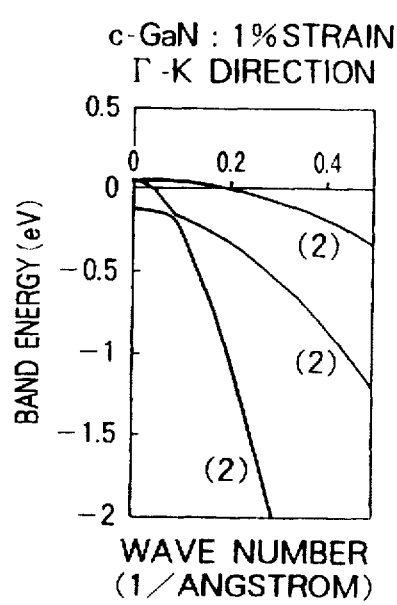
Figure 8A:
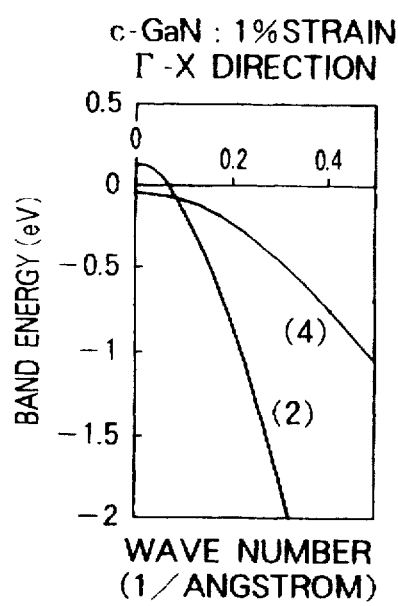
FIGS. 8A and 8B are characteristic curves showing band structures (energy-wave number relationship) of a zinc blend structure under 1% tensile strain GaN.
Figure 8B:
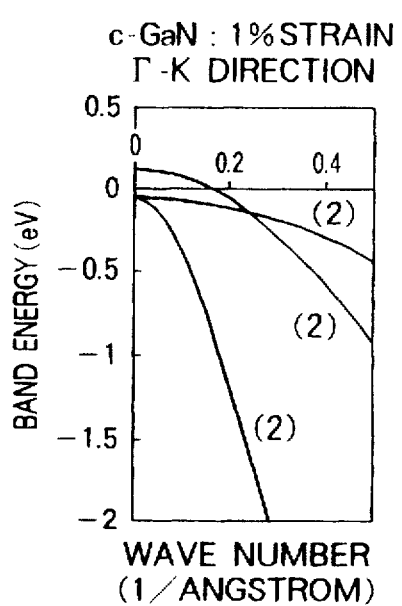
Figure 9A:
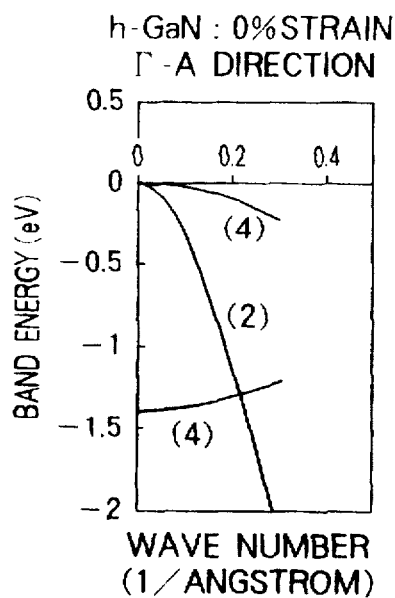
FIGS. 9A and 9B are characteristic curves showing band structures (energy-wave number relationship) of a Wurtzite structure lattice-matched GaN.
Figure 9B:
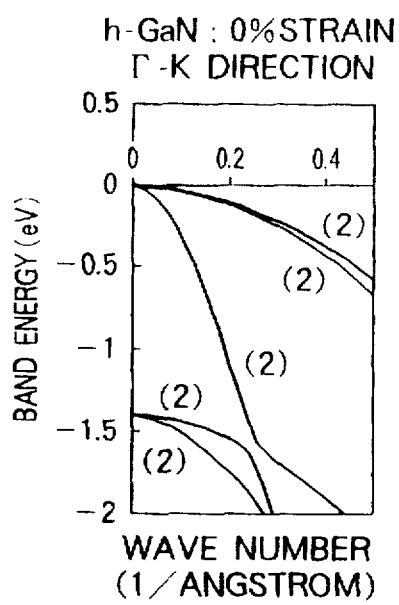
Figure 10A:
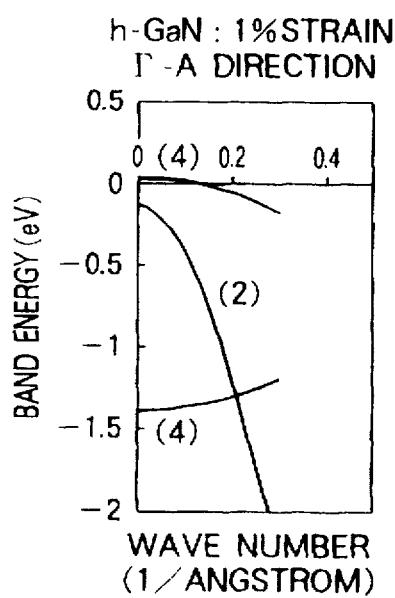
FIGS. 10A and 10B are characteristic curves showing band structures (energy-wave number relationship) of a Wurtzite structure 1% under compressive strain GaN.
Figure 10B:
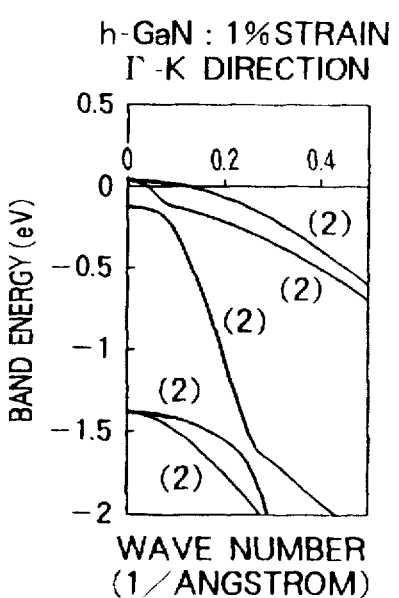
Figure 11A:
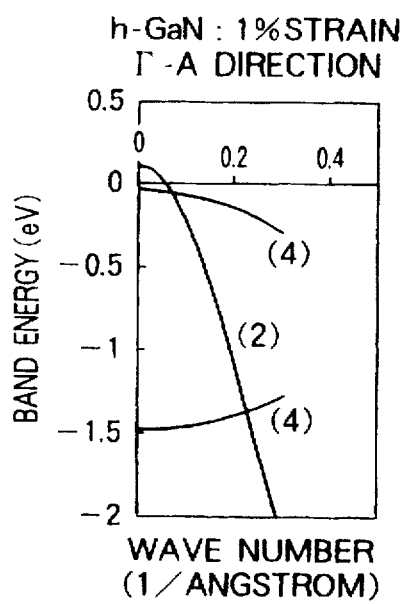
FIGS. 11A and 11B are characteristic curves showing band structures (energy-wave number relationship) of a Wurtzite structure under 1% tensile strain GaN.
Figure 11B:
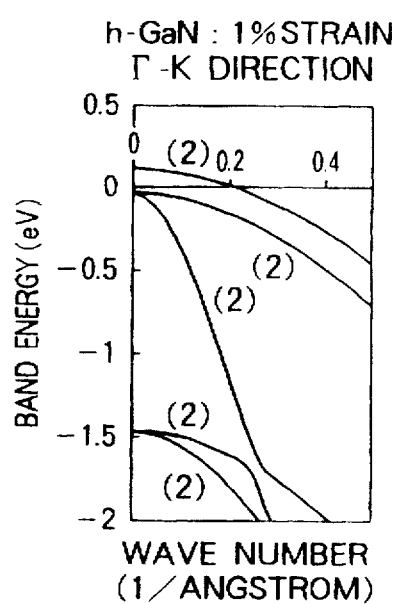
Figure 12:
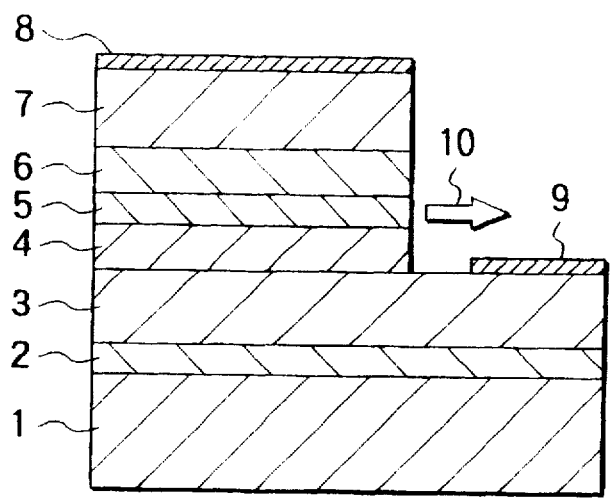
FIG. 12 is a section of the first embodiment of a semiconductor laser according to the present invention.

FIG. 12 is a section of the first embodiment of a semiconductor laser according to the present invention. The shown embodiment of the semiconductor laser is constructed by growing an $In_{0.06}Ga_{0.94}N$ buffer laser 2, an n-type $In_{0.06}Ga_{0.94}N$ clad layer 3, an n-type $In_{0.06}Al_{0.15}Ga_{0.79}N$ clad layer 4, an undoped GaN active layer 5 in layer thickness of 50 nm, a p-type $In_{006}Al_{015}Ga_{0.79}N$ clad layer 6 and p-type $In_{0.06}Ga_{0.94}N$ cap layer 7 in order on a (0001) azimuth sapphire substrate 1, a p-side electrode 8 is formed on the p-type $In_{0.06}Ga_{0.94}N$ cap layer 7, and n-side electrode 9 is formed on the n-type $In_{0.06}Ga_{0.94}N$ clad layer 3.

Figure 13:
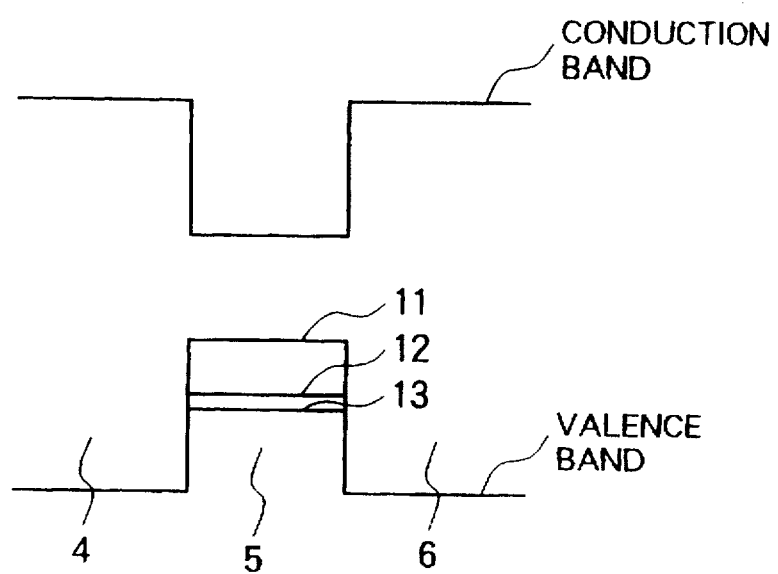
FIG. 13 is an illustration showing a Γ point band structure in the vicinity of active layer of the first embodiment of semiconductor laser according to the invention.

An emitted light 10 from the semiconductor laser is taken out from a direction parallel to the surface of the substrate 1. In this semiconductor laser, the n-type $In_{0.06}Ga_{0.94}N$ clad layer 3 serves as the substrate. In the active layer 5 is applied a tensile strain in the order of 0.7%. At this time, the band structure at the Γ point at the surrounding of the GaN active layer 5 is shown in FIG. 13. A valence band edge is primarily a band 11 based on p-type atomic orbital directed perpendicular to the surface of the substrate 1, and spaced from bands 12 and 13 based on p-type atomic orbital directed parallel to the surface of the sapphire substrate 1 in the amount of 50 meV at the Γ point.

In the shown embodiment of the semiconductor laser, a (0001) azimuth Wurtzite structure GaN is taken as a light emitting layer. By employing in-plane tensile strain, a band of a valence band edge of the light emitting layer primarily consists of p-type atomic orbital directed perpendicular to the substrate surface at the Γ point, and light is taken out in a direction parallel to the substrate surface. By this, a hole state density at the edge of the valence band is reduced to make available dipole moment greater to permit lowering of an oscillation threshold current.

[SECOND EMBODIMENT]

Figure 14:
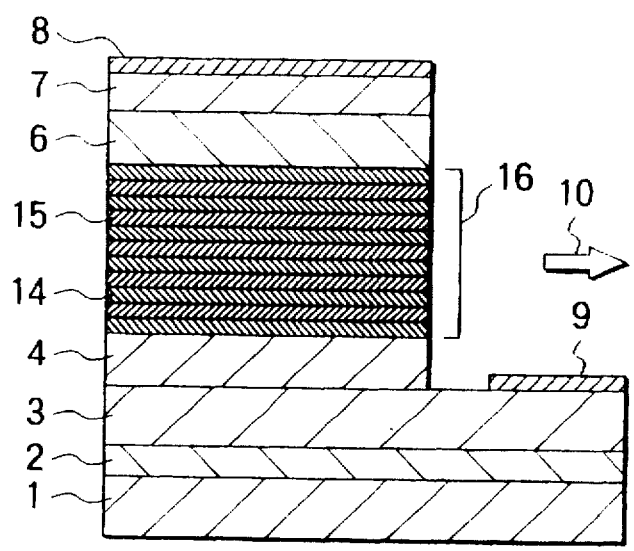
FIG. 14 is a section of the second embodiment of a semiconductor laser according to the present invention.

FIG. 14 is a section of the second embodiment of semiconductor laser according to the present invention. As shown in FIG. 14, the shown embodiment of semiconductor laser is constructed by growing an $In_{0.06}Ga_{0.94}N$ buffer layer 2, an n-type $In_{0.06}Ga_{0.94}N$ clad layer 3, an n-type $In_{0.06}Al_{0.15}Ga_{0.79}N$ clad layer 4, a multi quantum well active layer 16, in which p-type $In_{0.06}Al_{0.15}Ga_{0.79}N$ barrier layer 14 in a layer thickness of 10 nm and undoped GaN quantum well layer 15 in a layer thickness of 15 nm are stacked alternately for five cycles, a p-type $In_{006}Al_{015}Ga_{0.79}N$ clad layer 6 and a p-type $In_{0.06}Ga_{0.94}N$ cap layer 7 in order on a (0001) azimuth sapphire substrate 1. A p-side electrode 8 is formed on the p-type $In_{0.06}Ga_{0.94}N$ cap layer 7, and an n-side electrode 9 is formed on the n-type $In_{0.06}Ga_{0.94}N$ clad layer 3.

Figure 15:
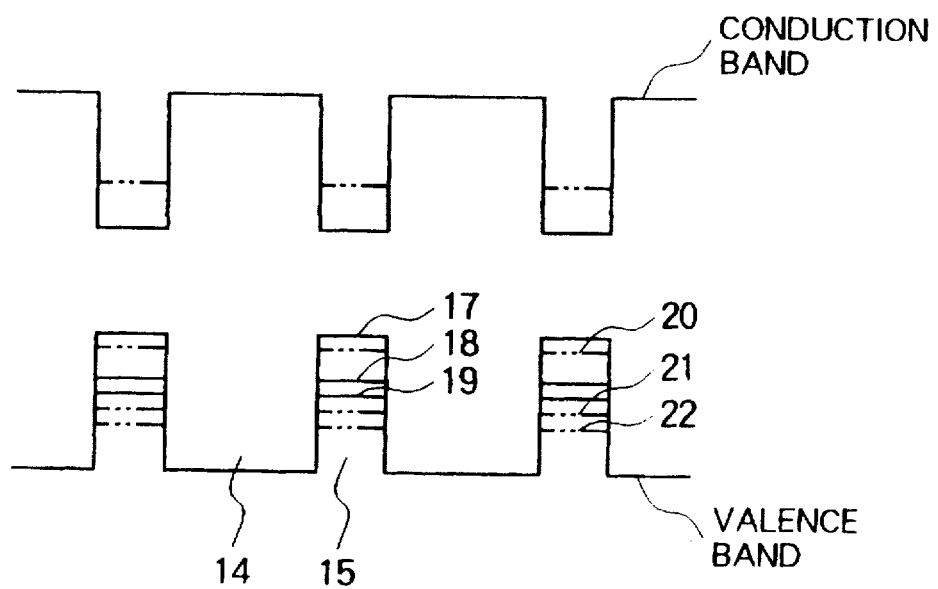
FIG. 15 is an illustration showing a Γ point band structure in the vicinity of active layer of the second embodiment of semiconductor laser according to the invention.

In this semiconductor laser, the n-type $In_{0.06}Ga_{0.94}N$ clad layer 3 serves as the substrate. The quantum well layer 15 is under tensile strain in the order of 0.7%. A band structure at the Γ point of the active layer 16 at this time is shown in FIG. 15. A valence band edge of the quantum well layer 15 is primarily a band 17 based on p-type atomic orbital directed perpendicular to the surface of the substrate 1, and spaced from bands 18 and 19 based on p-type atomic orbital directed in parallel to the surface of the sapphire substrate 1 in the amount of 50 meV at the Γ point. Furthermore, by quantum confinement effect, a sub-band 20 derived from the band 17 and sub-bands 21 and 22 derived from the bands 18 and 19 are formed.

An effective mass of the band 17 in z direction is several times smaller than those of the bands 18, 19. The spacing of the sub-bands 20, 21 become smaller than the spacing of bands 17, 18. However, since the layer thickness of the quantum well layer 15 is thick as 15 nm, the amount to become smaller is small. On the other hand, since the barrier layer 14 is doped by a p-type impurity, holes accumulate in the quantum well layer 15.

In the shown embodiment of the semiconductor laser, the active layer of the first embodiment is replaced with a multi quantum well layer 16 formed by alternately stacking quantum well layers 15 and barrier layers 14. Light emitting layers are the quantum wells, and p-type impurity is doped only in the barrier layers. For such construction, in addition to the effect of the first embodiment, hole concentration before current injection can be preliminarily set at high value to lower the oscillation threshold current.

[THIRD EMBODIMENT]

Figure 16:
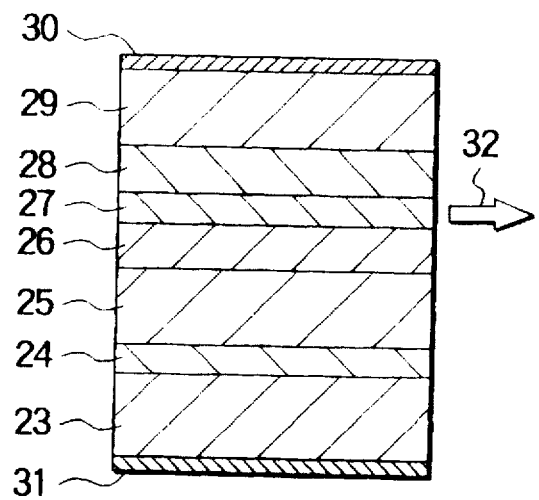
FIG. 16 is a section of the third embodiment of a semiconductor laser according to the present invention.

FIG. 16 is a section of the third embodiment of semiconductor laser according to the present invention. As shown in FIG. 16, the shown embodiment of semiconductor laser is constructed by growing an n-type $In_{0.06}Ga_{0.94}N$ buffer laser 24, an n-type $In_{0.06}Ga_{0.94}N$ clad layer 25, an n-type $In_{0.06}Al_{0.15}Ga_{0.79}N$ clad layer 26, an undoped GaN active layer 27 in a layer thickness of 50 nm, a p-type $In_{006}Al_{015}Ga_{0.79}N$ clad layer 28 and p-type $In_{0.06}Ga_{0.94}N$ cap layer 29 in order on a (001) azimuth n-type GaAs substrate 23. A p-side electrode 30 is formed on the p-type $In_{0.06}Ga_{0.94}N$ cap layer 29, and an n-side electrode 31 is formed on back surface of the substrate. An emitted light 32 of the semiconductor laser is taken out in a direction parallel to the primary surface of the GaAs substrate 23.

Figure 17:
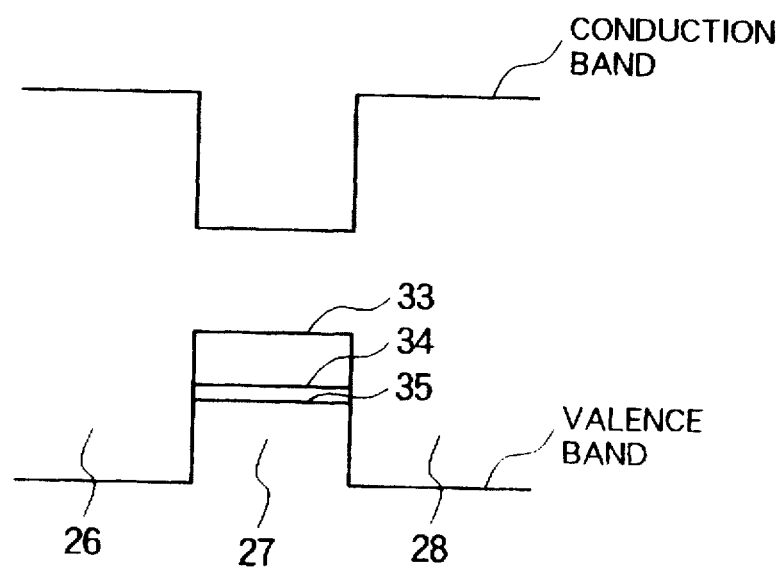
FIG. 17 is an illustration showing a Γ point band structure in the vicinity of active layer of the third embodiment of semiconductor laser according to the invention.

When the gallium nitride type material is formed on a (001) azimuth zinc blend type substrate, gallium nitride type material having a <001> azimuth perpendicular direction to the substrate surface, indeed, the n-type InGaN clad layer 25 indeed serves as substrate. To the GaN active layer 27, about 0.7% compressive strain is applied. The band structure at the Γ point in the vicinity of GaN active layer 27 is shown in FIG. 17. The valence band edge is the band 33 based on p-type atomic orbital directed in perpendicular direction to the surface of the substrate 23. The valence band edge is spaced apart from bands 34, 35 based on p-type atomic orbital direction in parallel direction to the surface of the GaAs substrate 23 in the extent about 70 meV at the Γ point.

In the shown embodiment of the semiconductor laser, by employing in-plane isotropic tensile strain with the zinc blend structure GaN as light emitting layer, the band of the valence band edge of the light emitting layer is primarily constructed from p-type atomic orbital directed in perpendicular direction to the substrate surface at the Γ point, and light is taken out in a direction parallel to the substrate surface. Thus, the hole state density of the valence band edge can be reduced to make available dipole moment greater to lower the oscillation threshold current.

[FOURTH EMBODIMENT]

Figure 18:
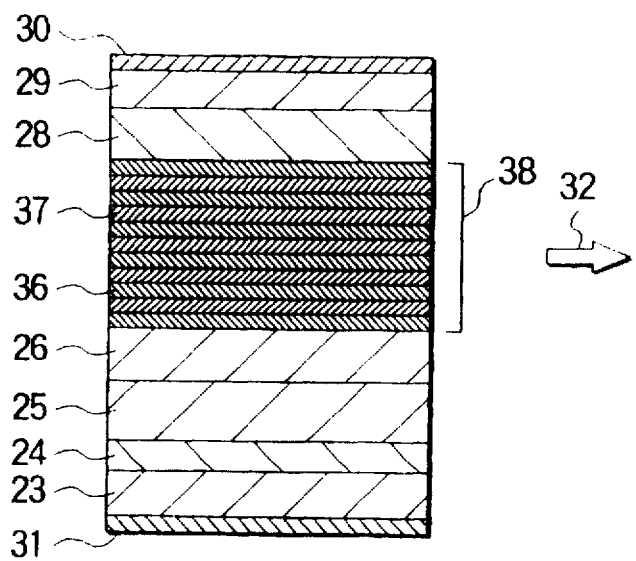
FIG. 18 is a section of the fourth embodiment of a semiconductor laser according to the present invention.

FIG. 18 is a section of the fourth embodiment of semiconductor laser according to the present invention. As shown in FIG. 18, the shown embodiment of semiconductor laser is constructed by growing an n-type $In_{0.06}Ga_{0.94}N$ buffer laser 24, an n-type $In_{0.06}Ga_{0.94}N$ clad layer 25, an n-type $In_{0.06}Al_{0.15}Ga_{0.79}N$ clad layer 26, a multi quantum well active layer 38, in which a p-type $In_{0.06}Al_{0.15}Ga_{0.79}N$ barrier layer 36 in a layer thickness of 10 nm and an undoped GaN quantum well layer 37 in a layer thickness of 15 nm are alternately stacked for five cycles, a p-type $In_{0.06}Al_{0.15}Ga_{0.79}N$ clad layer 28 and a p-type $In_{0.06}Ga_{0.94}N$ cap layer 29 in order on a (001) azimuth n-type GaAs substrate 23. A p-side electrode 30 is formed on the p-type $In_{0.06}Ga_{0.94}N$ cap layer 29, an n-side electrode 31 is formed on the back surface of the substrate. An emitted light 32 of the semiconductor laser is taken out in the direction parallel to the primary surface of the GaAs substrate 23.

Figure 19:
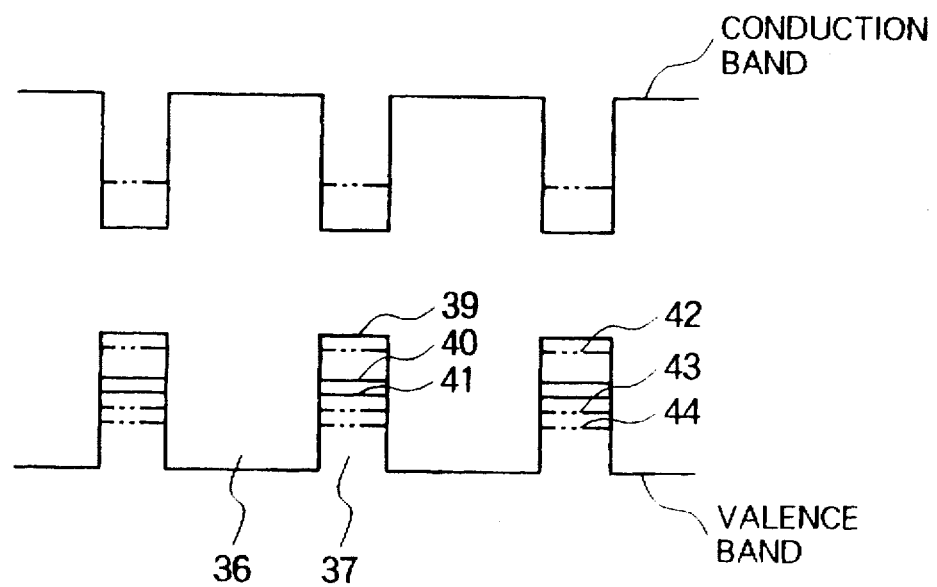
FIG. 19 is an illustration showing a Γ point band structure in the vicinity of active layer of the fourth embodiment of semiconductor laser according to the invention.

In this semiconductor laser, the n-type InGaN clad layer 25 serves as the substrate. To the active layer 37, about 0.7% compressive strain is applied. The band structure at the Γ point in the vicinity of active layer 38 is shown in FIG. 19. The valence band edge of the GaN quantum well layer 37 is the band 39 based on p-type atomic orbital directed in perpendicular direction to the surface of the substrate 23. The valence band edge is spaced apart from bands 40, 41 based on p-type atomic orbital direction in parallel direction to the surface of the substrate 23 in amount of about 70 meV at the Γ point. Furthermore, by quantum confinement effect, a sub-band 42 derived from the band 39 and sub-bands 43, 44 derived from the bands 40, 41 are formed.

An effective mass of the band 39 in z direction is several times smaller than those of the bands 40, 41. The spacing of the sub-bands 42, 43 become smaller than the spacing of the bands 39, 40. However, since the layer thickness of the quantum well layer 37 is thick as 15 nm, the amount to become smaller is small. On the other hand, since the barrier layer 36 is doped by p-type impurity, holes are accumulated in the quantum well layer 37.

In the semiconductor laser of the shown embodiment, the active layer in the semiconductor laser of the third embodiment is replaced with multi quantum wells, in which the quantum well layers and the barrier layers are stacked alternately. Light emitting layers are the quantum wells, and only barrier layers are doped by p-type impurity. The shown embodiment of semiconductor laser constructed as set forth above, the hole concentration before charging of current can be set higher to lower the oscillation threshold current, in addition to the effect of the third embodiment.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims. For instance, while the shown embodiment forms the light emitting layer by GaN, it is possible to form the light emitting layer with mixed crystals of InN, GaN, AlN having smaller composition ratio of In. Also, the present invention is applicable not only for the laser but also for gallium nitride type compound semiconductor light emitting diodes having low operation current and great light output.

As set forth above, the gallium nitride type compound semiconductor light emitting element according to the present invention employs a layer of (0001) azimuth or (001) azimuth of sufficient thickness as the light emitting layer comprising the quantum well layer. In addition, by applying in-plane isotropic tensile strain to take out the light in a direction parallel to the substrate surface density of the holes at the valence band edge can be reduced to permit use of large dipole moments. Accordingly, the threshold current of the semiconductor layer can be reduced. Also, light emitting efficiency of the light emitting diode can be improved.

What is claimed is:

1. A gallium nitride type compound semiconductor light emitting element comprising a quantum well layer consisting of a $Ga_xAl_{1-x}N$ layer ($0 \leq x \leq 1$) having a Wurtzite structure on a <0001> azimuth substrate surface, as a light emitting layer, said quantum well layer having a layer thickness greater than or equal to 10 nm and being under tensile strain, and light is taken out in parallel direction to said substrate surface.

2. A gallium nitride type compound semiconductor light emitting element as set forth in claim 1, wherein light is deflected from said light emitting element in a direction perpendicular to the substrate surface.

3. A gallium nitride type compound semiconductor light emitting element as set forth in claim 1, wherein said quantum well layer is under tensile strain of less than or equal to 3%.

4. A gallium nitride type compound semiconductor light emitting element as set forth in claim 1, and comprising a clad layer and a multi quantum well barrier layer both formed of InAlGaN.

5. A gallium nitride type compound semiconductor light emitting element as set forth in claim 4, wherein said multi quantum well barrier layer is doped by a p-type impurity.

6. A gallium nitride type compound semiconductor light emitting element as set forth in claim 4, wherein an InGaN buffer layer and an InGaN clad layer are formed on a sapphire substrate having a (0001) surface as major surface or on a GaAs substrate having a (001) surface as major surface, and said clad layer and active layer are formed thereon.

* * * * *